(12) United States Patent
Ooshiro et al.

(10) Patent No.: US 11,851,741 B2
(45) Date of Patent: Dec. 26, 2023

(54) HARD CARBON FILM, MANUFACTURING METHOD FOR SAME, AND SLIDING MEMBER

(71) Applicant: NIPPON ITF, INC., Kyoto (JP)

(72) Inventors: Takehiko Ooshiro, Kyoto (JP); Yukako Fukutani, Kyoto (JP); Koji Miyake, Kyoto (JP)

(73) Assignee: NIPPON ITF, INC., Kyoto (JP)

( * ) Notice: Subject to any disclaimer, the term of this patent is extended or adjusted under 35 U.S.C. 154(b) by 665 days.

(21) Appl. No.: 16/612,411

(22) PCT Filed: May 9, 2018

(86) PCT No.: PCT/JP2018/017862
§ 371 (c)(1),
(2) Date: Nov. 11, 2019

(87) PCT Pub. No.: WO2018/207803
PCT Pub. Date: Nov. 15, 2018

(65) Prior Publication Data
US 2021/0156021 A1    May 27, 2021

(30) Foreign Application Priority Data

May 11, 2017   (JP) ................................. 2017-094588

(51) Int. Cl.
*C23C 14/06*   (2006.01)
*C23C 14/24*   (2006.01)
(Continued)

(52) U.S. Cl.
CPC ...... *C23C 14/0605* (2013.01); *C23C 14/0611* (2013.01); *C23C 14/243* (2013.01);
(Continued)

(58) Field of Classification Search
CPC .................................................. C23C 14/0611
(Continued)

(56) References Cited

U.S. PATENT DOCUMENTS 6,068,883 A * 5/2000 Deguchi ................. C30B 25/02
427/535
2006/0263604 A1* 11/2006 Martin ................ F16H 57/0483
428/408
(Continued)

FOREIGN PATENT DOCUMENTS

CN        101432462      5/2009
CN        101760286      6/2010
(Continued)

OTHER PUBLICATIONS

Ferrari, "Raman spectroscopy of graphene and graphite: Disorder, electron-phonon coupling, doping, and nonadiabatic effects", 2007, Solid State Communications, vol. 143, p. 47-57. (Year: 2007).*
(Continued)

*Primary Examiner* — Humera N. Sheikh
*Assistant Examiner* — Kim S. Horger
(74) *Attorney, Agent, or Firm* — JCIPRNET

(57) ABSTRACT

A hard carbon film that forms a sliding surface of a sliding member, wherein the hard carbon film includes terminal atoms that bond to carbon atoms and has a plurality of protruding shaped parts, part of which protrude from the surface thereof, with the periphery of each of the plurality of protruding shaped parts being terminated by a terminal atom. A manufacturing method for the hard carbon film for producing the hard carbon film on a sliding surface of the sliding member using arc vapor deposition having graphite as the vaporization source, wherein a gas containing the terminal atoms that bond to carbon atoms is introduced, and the plurality of protruding shaped parts is grown on the
(Continued)

surface of the hard carbon film while terminating the periphery of the plurality of protruding shaped parts by bonding of the terminal atoms to carbon atoms.

14 Claims, 11 Drawing Sheets

(51) Int. Cl.
    *C23C 14/32*     (2006.01)
    *C23C 16/26*     (2006.01)
    *F16C 33/10*     (2006.01)

(52) U.S. Cl.
    CPC ............ *C23C 14/325* (2013.01); *C23C 16/26* (2013.01); *F16C 33/1025* (2013.01); *Y10T 428/30* (2015.01)

(58) Field of Classification Search
    USPC ........................................................ 428/408
    See application file for complete search history.

(56) References Cited

U.S. PATENT DOCUMENTS

| | | | |
|---|---|---|---|
| 2008/0220257 A1* | 9/2008 | Dekempeneer | C23C 28/343 428/408 |
| 2008/0226838 A1* | 9/2008 | Nishimura | C23C 16/4558 118/723 R |
| 2013/0108198 A1* | 5/2013 | Zushi | C23C 28/046 384/276 |
| 2014/0079910 A1* | 3/2014 | Tsugawa | C23C 16/0272 508/109 |
| 2015/0137457 A1* | 5/2015 | Iwashita | C23C 28/44 277/442 |
| 2015/0362071 A1* | 12/2015 | Ivanov | C23C 28/347 277/442 |
| 2016/0053371 A1* | 2/2016 | Tanaka | C23C 16/513 428/408 |
| 2016/0076141 A1* | 3/2016 | Hirota | C23C 14/0605 427/523 |
| 2016/0243625 A1* | 8/2016 | Waki | C23C 16/0254 |
| 2017/0002454 A1* | 1/2017 | Ozaki | C23C 28/322 |
| 2017/0167608 A1* | 6/2017 | Ooshiro | C23C 16/0281 |

FOREIGN PATENT DOCUMENTS

| | | | |
|---|---|---|---|
| CN | 105420670 | | 3/2016 |
| CN | 105765274 | | 7/2016 |
| JP | 2005307288 | | 11/2005 |
| JP | 2005307288 A | * | 11/2005 |
| JP | 2008-133788 | | 6/2008 |
| JP | 2009504448 | | 2/2009 |
| JP | 2015175014 | | 10/2015 |
| JP | 2016196690 | | 11/2016 |
| WO | WO-2015121944 A1 | * | 8/2015 .......... C23C 14/0036 |

OTHER PUBLICATIONS

"International Search Report (Form PCT/ISA/210)" of PCT/JP2018/017862, dated Jun. 19, 2018, with English translation thereof, pp. 1-2.

"Office Action of India Counterpart Application", dated Feb. 5, 2021, with English translation thereof, pp. 1-7.

"Office Action of Japan Counterpart Application", dated Jul. 10, 2017, with English translation thereof, pp. 1-6.

"Office Action of Japan Counterpart Application", dated Dec. 4, 2017, with English translation thereof, pp. 1-6.

"Office Action of Japan Counterpart Application", dated Mar. 27, 2018, with English translation thereof, pp. 1-6.

"Office Action of China Counterpart Application", dated Feb. 10, 2021, with English translation thereof, p. 1-p. 15.

\* cited by examiner

HARD CARBON FILM, MANUFACTURING METHOD FOR SAME, AND SLIDING MEMBER

CROSS-REFERENCE TO RELATED APPLICATION

This application is a 371 application of the international PCT application serial no. PCT/JP2018/017862, filed on May 9, 2018, which claims the priority benefit of Japan application no. 2017-094588, filed on May 11, 2017. The entirety of each of the above-mentioned patent applications is hereby incorporated by reference herein and made a part of this specification.

TECHNICAL FIELD

The present disclosure relates to a hard carbon film, a manufacturing method for the same, and a sliding member, and more specifically, a hard carbon film that exhibits excellent low abrasiveness while maintaining high wear resistance in oil containing a friction modifier, a manufacturing method for the same, and a sliding member.

BACKGROUND ART

Recently, providing a diamond-like carbon (DLC) film having excellent characteristics for sliding materials such as low abrasiveness, high wear resistance, and low adhesion (seizure resistance) on a sliding surface of a sliding member has been proposed and widely applied to sliding members of automobile parts and the like.

Meanwhile, among lubricants used in sliding members, oils containing a friction modifier such as sulfurized molybdenum dialkyldithiocarbamate (MoDTC) are used, and a technique for sliding pistons on which hard carbon films are formed and the like in such a friction modifier-containing oil is already known (e.g., Patent Literature 1).

That is, when such a friction modifier is added to an oil, a low-shear tribofilm is formed on a sliding surface and deposition brings a dramatically lowered friction coefficient. Particularly, the above-mentioned MoDTC exhibits a remarkably high abrasiveness reducing effect by forming $MoS_2$ on the sliding surface.

It is known that, in a case where a hard carbon film produced by using a CVD method in which a hydrocarbon gas serves as a film forming source is used, if the hard carbon film is used in an oil containing MoDTC as described above, a reaction product $MoO_3$ is produced on a film surface and abnormal wear occurs while the friction coefficient is lowered since the hard carbon film is a hydrogen-containing hard carbon film. Therefore, although abnormal wear can be suppressed by adding metal atoms to the film, there is concern of hardness of the film decreasing in that case.

On the other hand, a hard carbon film produced by using an arc vapor deposition in which graphite serves as a film forming source is a hydrogen-free hard carbon film, has high hardness and high wear resistance, and has a low friction coefficient in an oil and the like, and thus has been used for various applications such as automobile parts, and the like. While such a hydrogen-free hard carbon film does not show abnormal wear when it slides in an oil containing MoDTC, a tribofilm is rarely formed, and a friction coefficient thereof is higher than that of steel materials sliding against each other.

Furthermore, a hydrogen-free hard carbon film produced by using arc vapor deposition contains many protruding shaped parts that grow using, as nuclei, graphite fine particles scattered from a graphite vaporization source during deposition. The protruding shaped parts have a hardness equivalent to that of the hard carbon film, harm the hard carbon film itself and counterpart materials when they fall off during sliding, and particularly exhibit apparent aggressiveness to a counterpart material when a soft material such as aluminum or copper is used as a counterpart material.

For those reasons, when a hydrogen-free hard carbon film is applied to a sliding member, removal of protruding shaped parts through a lapping treatment or the like is essential, which is a cause of cost increase. In addition, since the protruding shaped parts strongly bond to the hard carbon film, it is difficult to completely remove the parts even if a lapping treatment or the like is performed.

Hence, the abrasiveness reduction effect in the above-described oil can be obtained by lowering a surface pressure caused by smoothing of the sliding surface and thickening the oil film. However, a hydrogen-free hard carbon film produced using the arc vapor deposition has a micro-convex structure on the sliding surface that is difficult to smoothen since the film has high hardness and the protruding shaped parts are not completely removed.

CITATION LIST

Patent Literature

[Patent Literature 1]
  Japanese Patent Laid-Open No. 2008-133788

SUMMARY OF INVENTION

Technical Problem

The present invention provides a manufacturing technology for a hard carbon film that in which not only excellent wear resistance but also sufficiently low abrasiveness can be exhibited by smoothing a sliding surface while increase in costs as well as time and effort because of lapping treatments and the like for sliding in oil containing MoDTC can be curbed.

Solution to Problem

The present inventor has intensively studied how a sliding surface can be smoothed while suppressing occurrences of cost increases as well as time and effort because of lapping treatments and the like using hydrogen-free hard carbon films that have excellent wear resistance. As a result, the inventor has paid attention to the fact that, when a hard carbon film is deposited using a CVD method such as a plasma CVD method, fragments of the hard carbon film that are separated from a jig, or the like, which had a deposition object set thereon, and adhering to the hard carbon film under deposition can be easily removed from the hard carbon film.

That is, when a hard carbon film is deposited using a plasma CVD method or the like, the hard carbon film is formed on the deposition object as well as the jig having the deposition object set thereon, a wall surface of the deposition tank, and so on. If the deposition is repeated with the hard carbon film formed on the jig, the wall surface of the deposition tank, and the like left intact, the hard carbon film gets thicker, separates therefrom due to excessive internal stress, and is released to the inside of the deposition tank. Even if the separated hard carbon film is caused to stick to the deposition object, it does not firmly bond to the hard carbon film being deposited, and may easily fall off therefrom due to air blowing, wiping, or the like. However, since a recess can be formed at a place from which the hard carbon film has fallen off, this method has usually been avoided until now due to deposition defects.

The reasons why the separated hard carbon film does not strongly bond to the hard carbon film being deposited in the deposition of the hard carbon film using a plasma CVD method or the like as described above are thought to be as follows.

First, the hard carbon film separated from the jig, the wall surface of the deposition tank, and the like enters a very active state since the film has many dangling bonds generated during the separation on the surface right after the separation. However, after that, the hard carbon film comes to have an inert surface since the dangling bonds react with ions and radicals of hydrogen and hydrocarbons in the plasma while moving inside the deposition tank and are terminated by hydrogen atoms or the like.

Meanwhile, although dangling bonds are generated on the surface of the hard carbon film by performing physical etching using collisions of ions with the surface of the hard carbon film during the deposition or chemical etching using hydrogen ions on the surface of the deposition object, the generated dangling bonds bond to ions and radicals of hydrogen and hydrocarbons. Since the bonding is repeated on the surface of the hard carbon film, the surface of the hard carbon film enters an inert state even during the deposition in comparison to a surface of hydrogen-free hard carbon film being deposited using an arc vapor deposition.

Since both the surface of the separated hard carbon film and the surface of the deposition object become inert, even if the separated hard carbon film adheres to the hard carbon film being deposited, no firm bonding occurs.

The present inventor thought that, if protruding shaped parts generated through arc vapor deposition can be formed to be an inert surface like the above-described separated hard carbon film and a surface of a deposition object can be caused to enter an inert state, the protruding shaped parts can be easily removed without bonding to the hard carbon film being deposited, and a hard carbon film from which protruding shaped parts are easily removable can be produced even using arc vapor deposition.

Based on the considerations described above, the present inventor has intensively studied how to realize the considerations in detail, and found that, in manufacturing of a hard carbon film using arc vapor deposition, when a hard carbon film is deposited while introducing a hydrocarbon gas containing terminal atoms such as hydrogen atoms or the like, a hydrogen-containing hard carbon film terminated by hydrogen atoms or the like is formed to cover protruding shaped parts and the protruding shaped parts easily fall off.

That is, if a hydrogen-containing hard carbon film terminated by hydrogen atoms or the like is formed to cover the protruding shaped parts, bonding of the hydrogen-containing hard carbon film formed in arc vapor deposition to the protruding shaped parts is inhibited since the hard carbon film has an inert surface, cracking is thus likely to occur at the interface between the hard carbon film and the protruding shaped parts, and the protruding shaped parts can be caused to easily fall off from the hard carbon film. In addition, since the protruding shaped parts can be caused to easily fall off from the hard carbon film even in a weak lapping treatment such as air lapping, the surface of the hard carbon film can be smoothed without incurring costs and effort, and the hard carbon film can be prevented from unnecessarily wearing out.

In addition, aggressiveness to a counterpart material can also be dramatically reduced. Furthermore, since recesses formed after the protruding shaped parts fall off function as oil reservoirs, a friction coefficient can be significantly lowered. Meanwhile, by appropriately limiting an amount of supply of terminal atoms such as hydrogen atoms during deposition using arc vapor deposition, excellent properties of hydrogen-free hard carbon film such as high wear resistance in an inner layer part of the hard carbon film can be maintained.

However, in a case where the hard carbon film produced using arc vapor deposition is deposited by being continuously irradiated with carbon ions from a graphite vaporization source, it is difficult to sufficiently terminate the dangling bonds on the surface of the hard carbon film even if a hydrocarbon gas is being introduced during the deposition since the number of hydrogen atoms serving for bonds becomes insufficient.

Therefore, the present inventor conducted further study and has found that, in a case where a hard carbon layer containing a larger amount of terminal atoms and a hard carbon layer containing a smaller amount of terminal atoms are alternately layered at a nano level in a state in which the layers are not periodically irradiated with carbon ions coming from a graphite vaporization source and, for example, a super-multilayer structure is formed, dangling bonds in the hard carbon layer formed on the surface can be sufficiently terminated, and the protruding shaped parts can be caused to easily fall off.

An aspect of the disclosure is based on the above-described knowledge, and an aspect of the disclosure is a hard carbon film forming a sliding surface of a sliding member, the hard carbon film containing terminal atoms that bond to carbon atoms, and a plurality of protruding shaped parts each of which has a part projecting from a surface of the hard carbon film, in which the periphery of each of the plurality of protruding shaped parts is terminated by the terminal atoms.

In addition, an aspect of the disclosure is the hard carbon film formed in a way that a hard carbon layer containing a larger amount of terminal atoms bonding to carbon atoms and a hard carbon layer containing a smaller amount of terminal atoms bonding to carbon atoms are alternately layered at a nano level.

Next, an aspect of the disclosure is the hard carbon film in which a distribution density of the protruding shaped parts increases toward the surface.

It is difficult to cause the protruding shaped parts to fall off if the protruding shaped parts are formed inside the hard carbon film, and thus it is preferable to form the protruding shaped parts near the surface. Thus, a distribution density of the protruding shaped parts preferably increases toward the surface of the hard carbon film.

An aspect of the disclosure is the hard carbon film in which among the plurality of protruding shaped parts, the number of protruding shaped parts growing from a position shallower than a depth of 1.5 µm from the surface is 90% or more of the entire plurality of protruding shaped parts.

If the protruding shaped parts grow from a deep portion in the hard carbon film, it is difficult to cause the protruding shaped parts to fall off from the surface of the hard carbon film. Specifically, even if deposition is performed while terminating a periphery of the protruding shaped parts with terminal atoms, bonding of the hard carbon film to the protruding shaped parts gradually increases according to the growth, and when the protruding shaped parts are at a depth of 1.5 μm or deeper from the surface, it becomes difficult for them to fall off. Thus, it is preferable for the protruding shaped parts to grow from a position shallower than 1.5 μm from the surface. Further, if the number of protruding shaped parts among the plurality of protruding shaped parts that has grown as described above is 90% or more of the entire plurality of protruding shaped parts, the protruding shaped parts are caused to fall off and further falling of the protruding shaped parts during sliding is inhibited.

Next, terminal atoms will be studied. In a case when atoms having three or more bonds are used as the terminal atoms, the bonds form a three-dimensional structure, and thus it is difficult to sufficiently terminate the periphery of the protruding shaped parts. On the other hand, atoms having one bond can be caused to easily bond to carbon atoms in the periphery of the protruding shaped parts, and therefore, the periphery of the protruding shaped parts can be easily terminated. Likewise, atoms having two bonds form a linear structure, thus they can be caused to easily bond to carbon atoms in the periphery of the protruding shaped parts, and therefore the periphery of the protruding shaped parts can be easily terminated.

At this time, since terminal atoms remaining in the film cause a larger space in which there is no bonding between atoms in the hard carbon film as their atomic weight becomes greater, this space causing a significant decrease in hardness, atoms having a smaller atomic weight are therefore preferable as terminal atoms in the present disclosure.

Further, since such terminal atoms are supplied from a gas introduced during deposition, if the gas is not industrially easy to handle, facility expenses, production costs, and the like of the hard carbon film increase, which leads to a decrease in productivity, and therefore a method of removing the protruding shaped parts through filtering may be cost-advantageous. Therefore, it is preferable to use a gas containing terminal atoms that is industrially easy to handle when the terminal atoms are introduced in terms of safety and costs.

Considering the above, any of hydrogen atoms, oxygen atoms, and fluorine atoms are preferable as terminal atoms of the present disclosure, and among these, hydrogen atoms having the smallest atomic weight and forming one bond are particularly preferable.

In addition, since when a smaller amount of terminal atoms is present in the hard carbon film, higher hardness in the hard carbon film is maintained and better wear resistance properties are exhibited, a smaller amount of terminal atoms is preferable in terms of maintaining high hardness. In an early stage of deposition of the hard carbon film, the number of protruding shaped parts generated is small, and even if an amount of terminal atoms is increased, the effects thereof are small, and therefore, it is preferable that an amount of terminal atoms be small in the early stage of deposition, and an amount of terminal atoms be great at an end stage of the deposition in which the number of protruding shaped parts increases, especially, on the film surface. Specifically, it is preferable that a content of terminal atoms in the region of the hard carbon film to a thickness of 0.3 μm in the early stage of the deposition be smaller than a content of terminal atoms in regions shallower than the aforementioned region.

Furthermore, although Ar gas is introduced together with the gas containing terminal atoms, the terminal atoms are easily removed due to the effect of physical etching by Ar ions in terms of direct exposure to plasma, the physical etching by Ar ions does not reach the boundary part between the hard carbon film and the protruding shaped parts that are not directly exposed to plasma, and a carbon layer with a higher content of terminal atoms than other parts of the hard carbon film is formed at peripheries, particularly the bottom, of the protruding shaped parts, and therefore, the protruding shaped parts can be caused to efficiently fall off.

An aspect of the disclosure is based on the above-described knowledge, and an aspect of the disclosure is the hard carbon film in which the terminal atoms are any one of hydrogen atoms, oxygen atoms, and fluorine atoms.

In addition, an aspect of the disclosure is the hard carbon film in which a content of the terminal atoms in a region to a thickness of 0.3 μm at the beginning of deposition of the hard carbon film is lower than a content of the terminal atoms in a shallower region than the aforementioned region.

Furthermore, an aspect of the disclosure is the hard carbon film in which a carbon layer having a higher content of terminal atoms than other parts is formed in a periphery of the protruding shaped parts.

An aspect of the disclosure is the hard carbon film in which the terminal atoms are hydrogen atoms, and a content of hydrogen is 5 to 15 atom%.

Since hydrogen atoms have the smallest atomic weight and one bond as described above, hydrogen atoms are particularly preferable as terminal atoms. In order to make the protruding shaped parts fall off more easily in this case, a content of hydrogen in the hard carbon film is preferably 5 to 15 atom %.

In the case of a content of less than 5 atom %, it is not possible to sufficiently obtain the effect of causing the protruding shaped parts to fall off despite termination. On the other hand, since in the case of a content of over 15 atom %, the number of $sp^3$ bonds decreases, it is therefore difficult for high hardness to be maintained in the hard carbon film, and therefore it is not possible to secure sufficient wear resistance.

An aspect of the disclosure is the hard carbon film in which a nanoindentation hardness is 35 GPa or greater.

If a nanoindentation hardness is 35 GPa or greater, a hard carbon film having high hardness and excellent wear resistance can be obtained.

An aspect of the disclosure is the hard carbon film in which a peak position of a G-peak in a Raman spectrum is higher in an inside than the surface.

It has been ascertained that a peak position of a G-peak in a Raman spectrum is inversely proportional to a content of hydrogen in a hard carbon film. Specifically, a hard carbon film whose peak position of a G-peak is high is a hard carbon film with a low content of hydrogen, and a hard carbon film whose peak position of a G-peak is low is a hard carbon film with a high content of hydrogen.

For this reason, a hard carbon film that is formed with supply of a sufficient amount of hydrogen atoms serving as terminal atoms to a surface can be provided using a hard carbon film whose peak position of a G-peak is higher in the inside than the surface which is a hard carbon film having a high content of hydrogen in the surface and a low content of hydrogen in the inside.

An aspect of the disclosure is the hard carbon film in which a carbon film with a lower hardness is coated as an upper layer.

Although it is known from previously that a low friction coefficient is obtained if a low-hardness carbon film is coated on a hard carbon film, in a case where a low-hardness carbon film is coated on a conventional high-hardness hard carbon film produced through vacuum arc vapor deposition, it is difficult to perform a strong lapping treatment to remove protruding shaped parts formed on the high-hardness hard carbon film since the low-hardness carbon film is coated on the high-hardness hard carbon film, and thus it is not possible to sufficiently remove the protruding shaped parts before use. In addition, since the protruding shaped parts that have not been removed fall off during sliding, abrasive wear occurs, which simply damages the low-hardness carbon film, and therefore, even if the low-hardness carbon film is coated thereon, it is difficult to obtain an abrasiveness reducing effect accordingly.

Thus, conventionally when a low-hardness carbon film is coated as the upper layer of a high-hardness hard carbon film, the number of protruding shaped parts is reduced by performing filtering using a filtered arc method or the like in advance or formation of protruding shaped parts is prevented using a sputtering method or the like at the time of deposition of the high-hardness hard carbon film. However, there are problems that productivity decreases in the case where a filtered arc method or the like is employed and only hard carbon films with a lower hardness and reduced wear resistance than those in vacuum arc vapor deposition are formed when a sputtering method or the like is employed.

On the other hand, in a case where a carbon film with a lower hardness than that of the above-described hard carbon film is further provided as an upper layer of the hard carbon film, the protruding shaped parts can easily fall off from the hard carbon film, and thus the protruding shaped parts can be easily removed even with a weak lapping treatment as the treatment will not affect the carbon film with a lower hardness, and thus a remarkable abrasiveness reducing effect can be obtained. In addition, in addition to a significant abrasiveness reducing effect, neither a decrease in productivity in a case where a filtered arc method or the like is employed nor a decrease in wear resistance in a case where a sputtering method or the like is employed are caused.

An aspect of the disclosure is the hard carbon film in which the low-hardness carbon film is a carbon film having a content of hydrogen of 20 atom% or higher and less than 50 atom%.

In a case where a low-hardness carbon film with a high content of hydrogen is caused to slide in oil containing MoDTC, although the film rapidly wears out due to abnormal wear, such abnormal wear is mild even though a rate of wearing is high, and thus the sliding surface is suitably flattened and low abrasiveness is exhibited. However, if a content of hydrogen is excessively high, hardness excessively decreases and the sliding surface is thus easily damaged, wear caused by other factors such as scratches due to protrusions or foreign substances of a counterpart material becomes more dominant than abnormal wear caused by oil containing MoDTC, and therefore it is difficult to form a surface suitable for sliding. Therefore, a content of hydrogen in a low-hardness carbon film that is caused to slide in oil containing MoDTC is preferably 20 atom % or higher and lower than 50 atom %.

In the present disclosure, such a low-hardness carbon film with a content of hydrogen of 20 atom % or higher and lower than 50 atom % is coated on the high-hardness hard carbon film, and thus even if the low-hardness carbon film wears out further, wear does not progress any further due to the high-hardness hard carbon film, and seizure does not occur. In addition, even if the low-hardness carbon film wears out further and the high-hardness hard carbon film starts to be exposed, a surface suitable for sliding has already been formed, and thus low abrasiveness is maintained as it is.

An aspect of the disclosure is the hard carbon film in which the low-hardness carbon film has an ID/IG ratio in a Raman spectrum of 0.7 or higher.

It is known that an ID/IG ratio is correlated to a $sp^3 / (sp^3+sp^2)$ ratio on a carbon film. Specifically, if the ID/IG ratio gets higher, the $sp^3$ ratio becomes lower, the above-described abnormal wear in oil containing MoDTC is more likely to occur in a carbon film containing hydrogen, and therefore a surface suitable for sliding can be formed in a shorter period of time.

If ID/IG of a carbon film is 0.7 or greater, the above-described low-hardness carbon film in which abnormal wear in oil containing MoDTC is more likely to occur can be provided.

An aspect of the disclosure is the hard carbon film in which the low-hardness carbon film contains any one of a metal element, silicon, nitrogen, and boron.

If these elements are added to the low-hardness carbon film, generation of a tribofilm can be promoted or occurrence of abnormal wear can be inhibited, and therefore low abrasiveness can be exhibited in a mechanism different from that in a case where such elements are not added. Further, examples of specific metal elements include Cr, Fe, W, Ti, and the like.

An aspect of the disclosure is the hard carbon film in which a thickness of the low-hardness carbon film is 0.1 to 1.0 μm.

If a thickness of the low-hardness carbon film is excessively thin, the above-described effects brought by the low-hardness carbon film will not be sufficiently exhibited. On the other hand, if a thickness thereof is excessively thick, it is difficult to cause the protruding shaped parts formed on the hard carbon film to fall off. A thickness thereof is preferably 0.1 to 1.0 μm, and more preferably 0.2 to 0.5 μm.

An aspect of the disclosure is a sliding member to be used for sliding in an oil containing sulfurized molybdenum dialkyldithiocarbamate, in which the hard carbon film is formed on a sliding surface.

If a sliding member having a sliding surface on which the above hard carbon films are formed is caused to slide in oil containing MoDTC, no abnormal wear occurs in the high-hardness hard carbon film, and in a case where a low-hardness carbon film is coated as an upper layer thereof, the low-hardness carbon film soon disappears due to abnormal wear, and therefore, by forming a surface suitable for sliding in a shorter period of time, a friction coefficient thereof can be significantly decreased.

An aspect of the disclosure is a manufacturing method for a hard carbon film for depositing a hard carbon film on a sliding surface of a sliding member using arc vapor deposition having graphite as a vaporization source, and the method includes introducing a gas containing terminal atoms that bond to carbon atoms, and causing a plurality of protruding shaped parts to grow on a surface of the hard carbon films while terminating a periphery of the plurality of protruding shaped parts by bonding the terminal atoms to the carbon atoms.

When the hard carbon film is deposited on the sliding surface of the sliding member using arc vapor deposition having graphite as a vaporization source, a gas containing terminal atoms that bond to carbon atoms is introduced, and the plurality of protruding shaped parts is caused to grow on the surface of the hard carbon film while allowing the carbon atoms in the periphery thereof to bond to and to be terminated by the terminal atoms, thus bonding of the hard carbon film to the protruding shaped parts can be inhibited as described above, cracks are likely to occur at the interface between the hard carbon film and the protruding shaped parts, and accordingly the protruding shaped parts can be caused to easily fall off from the hard carbon film, thus the surface of the hard carbon film can be easily smoothed, aggressiveness to a counterpart material can be dramatically reduced, and a friction coefficient can be significantly decreased.

An aspect of the disclosure is the manufacturing method for a hard carbon film, in which, in the arc vapor deposition, the hard carbon film is deposited in a state in which the film is not irradiated with carbon ions coming from the graphite vaporization source at regular time intervals.

By depositing the hard carbon film while setting a state in which the film is not irradiated with carbon ions coming from the graphite vaporization source at regular time intervals, a hard carbon layer containing a larger amount of terminal atoms and a hard carbon layer containing a smaller amount of terminal atoms are alternately layered at a nano level as described above, and thus dangling bonds can be sufficiently terminated in the hard carbon layer formed on the surface, and therefore the protruding shaped parts can be caused to easily fall off.

An example of a specific method of setting a state in which a film is not irradiated with carbon ions coming from a graphite vaporization source may include, for example, a method of periodically stopping arc discharge. However, in this case, graphite particles are easily generated when arc discharge is resumed, and there is slight concern of many protruding shaped parts being formed.

In addition, a method of periodically blocking irradiation of carbon ions using a shielding plate or the like may be exemplified. However, in this case, there is slight concern of blocked carbon ions being wasted.

Considering the above-described points, a method of periodically moving a base material outside a range of irradiation of carbon ions is more preferable, and in that case, continuously disposing the base material in a cylindrical jig or the like and rotating the base material in a circumferential direction using a deposition apparatus having a rotation/revolution mechanism is particularly preferable. Accordingly, any base material is constantly present in the range of irradiation, and thus deposition can be efficiently performed without causing waste of carbon ions.

An aspect of the disclosure is the manufacturing method for a hard carbon film, in which a gas containing any one of hydrogen atoms, oxygen atoms, fluorine atoms is used as a gas containing terminal atoms that bond to carbon atoms, and the hard carbon film is deposited while an amount of the gas introduced is caused to change over time.

As described above, hydrogen atoms, oxygen atoms, and fluorine atoms are preferable as terminal atoms that bond to carbon atoms. In addition, by appropriately controlling bonding of terminal atoms to carbon atoms in a periphery of the protruding shaped parts while changing an amount of gas introduced over time, a hard carbon film from which the protruding shaped parts formed on the growing hard carbon film can easily fall off can be deposited.

An aspect of the disclosure is the manufacturing method for a hard carbon film, in which, in a region of a hard carbon film to a thickness of 0.3 μm at the beginning of deposition, the hard carbon film is deposited by reducing an amount of the gas introduced at the beginning of deposition compared with that for other regions.

The protruding shaped parts can be efficiently terminated by reducing an amount of gas introduced at the beginning of deposition in which the number of protruding shaped parts is small to suppress deterioration in hardness and increasing an amount of gas introduced at the end of the deposition in which the number of protruding shaped parts is large.

An aspect of the disclosure is the manufacturing method for a hard carbon film, in which the hard carbon film is deposited while introducing Ar gas together with the gas containing terminal atoms that bond to carbon atoms.

By causing physical etching using Ar ions during deposition of the hard carbon film, a layer having a higher content of terminal atoms than other parts of the hard carbon film is formed in a periphery of the protruding shaped parts, and thus the protruding shaped parts can be caused to fall off more efficiently.

Advantageous Effects of Invention

According to the present disclosure, a manufacturing technology for a hard carbon film that can exhibit not only excellent wear resistance but also sufficiently low abrasiveness by smoothing of a sliding surface while suppressing occurrences of cost increases as well as time and effort because of lapping treatments and the like for sliding in oil containing MoDTC can be provided.

DESCRIPTION OF EMBODIMENTS

The present disclosure will be described based on embodiments using the appended drawings below. Furthermore, although a vacuum arc vapor deposition will be exemplified as an arc vapor deposition below, there is no limitation to arc vapor deposition. In addition, although hydrogen atoms are used as terminal atoms that bond to carbon atoms, the terminal atoms may be oxygen atoms or fluorine atoms.

[1] Configuration of Hard Carbon Film

Figure 1:
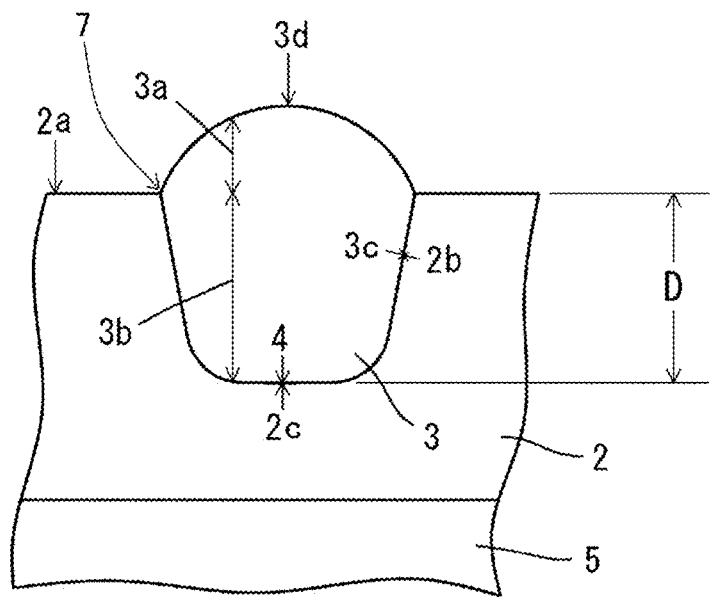
FIG. 1 is a schematic diagram illustrating a cross-section of a hard carbon film according to an embodiment of the present disclosure.
Figure 2:
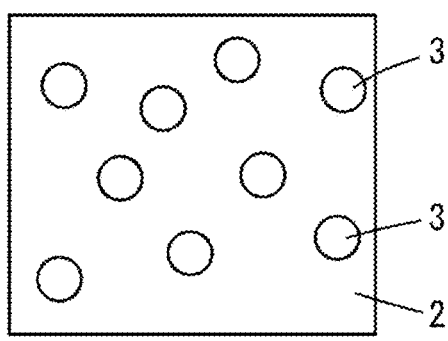
FIG. 2 is a schematic diagram illustrating a surface of the hard carbon film according to an embodiment of the present disclosure.

FIG. 1 is a schematic diagram illustrating a cross-section of a hard carbon film according to the present embodiment, and FIG. 2 is a schematic diagram illustrating a surface of the hard carbon film according to the present embodiment. Furthermore, in FIGS. 1 and 2, 2 denotes the hard carbon film, 3 denotes an protruding shaped part, 5 denotes a base material, 2a denotes an outermost surface part of the hard carbon film 2, 3a denotes a part of the protruding shaped part 3 protruding from a surface of the hard carbon film 2, 3b denotes a part of the protruding shaped part 3 below the surface of the hard carbon film 2, 3c denotes a side outer circumferential part of 3b, 2b denotes a surface part of the hard carbon film 2 facing 3c, and 3d denotes an outermost surface part of the protruding shaped part 3. In addition, 4 denotes a bottom of the protruding shaped part 3 that is a part of a periphery at the part 3b below the surface of the hard carbon film 2, 2c denotes a surface part of the hard carbon film 2 facing 4, and 7 denotes a boundary between the protruding shaped part 3 and the hard carbon film 2 on a film surface. Furthermore, D denotes a depth of the protruding shaped part 3 from the surface of the hard carbon film 2.

As illustrated in FIGS. 1 and 2, the hard carbon film 2 according to the present embodiment is formed on the base material 5 and has a plurality of protruding shaped parts 3 each of which is a part protruding from the surface of the hard carbon film.

In the present embodiment, the hard carbon film 2 is deposited using a vacuum arc vapor deposition, and thus the protruding shaped parts 3 are formed toward the surface of the hard carbon film 2. However, since a gas containing hydrogen atoms, such as a hydrocarbon gas or hydrogen gas is introduced during deposition in the present embodiment, the surface parts 2b and 2c of the hard carbon film 2 and the outer circumferential part 3c and the bottom 4 of the protruding shaped part 3 are covered by a hydrogen-containing carbon film terminated by hydrogen atoms bonding to carbon atoms.

Since the protruding shaped parts 3 whose periphery is covered by the hydrogen-containing carbon film as described above are inhibited from bonding to the deposited hard carbon film 2, cracking may be caused to easily occur at the interface between the hard carbon film and the protruding shaped parts, and thus the protruding shaped parts can fall off and be removed even in a weak lapping process, the hard carbon film can be easily smoothed, and aggressiveness to counterpart materials can be significantly reduced.

In addition, the recess formed after the protruding shaped part falls off functions as an oil reservoir during sliding in an oil, and thus a friction coefficient of the hard carbon film can be drastically reduced.

Accordingly, the hard carbon film according to the present embodiment can exhibit not only excellent wear resistance which is a characteristic of hard carbon films deposited in the vacuum arc vapor deposition but also excellent low abrasiveness.

However, when a hard carbon film produced in an arc vapor deposition is deposited in a state in which the film is continuously irradiated with carbon ions generated from a graphite vaporization source as described above, even if a hydrocarbon gas is introduced during the deposition, the supply of hydrogen atoms serving for bonds is insufficient for the generated carbon ions, and thus it is difficult to sufficiently terminate dangling bonds on the surface of the hard carbon film.

Thus, in the present embodiment, it is desirable to set a state in which a film is periodically irradiated with carbon ions coming from the graphite vaporization source at the time of deposition as described above. Accordingly, a hard carbon layer containing a larger amount of hydrogen and a hard carbon layer containing a smaller amount of hydrogen are alternately layered at a nano level, and dangling bonds in the hard carbon layer formed on the surface can be sufficiently terminated.

Figure 3:
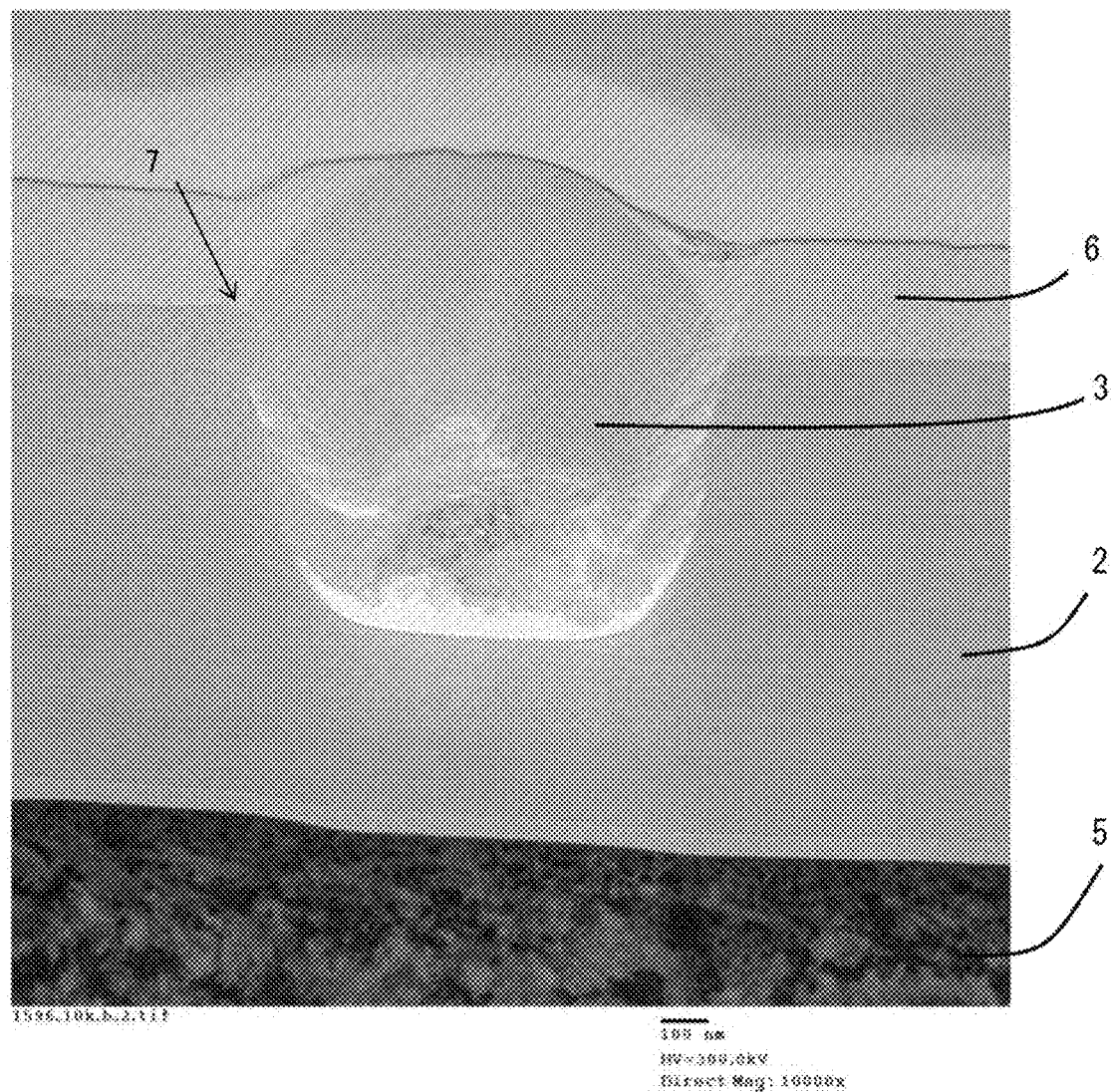
FIG. 3 is a TEM image (bright field image) of a cross-section of a hard carbon film according to an embodiment of the present disclosure.
Figure 4:
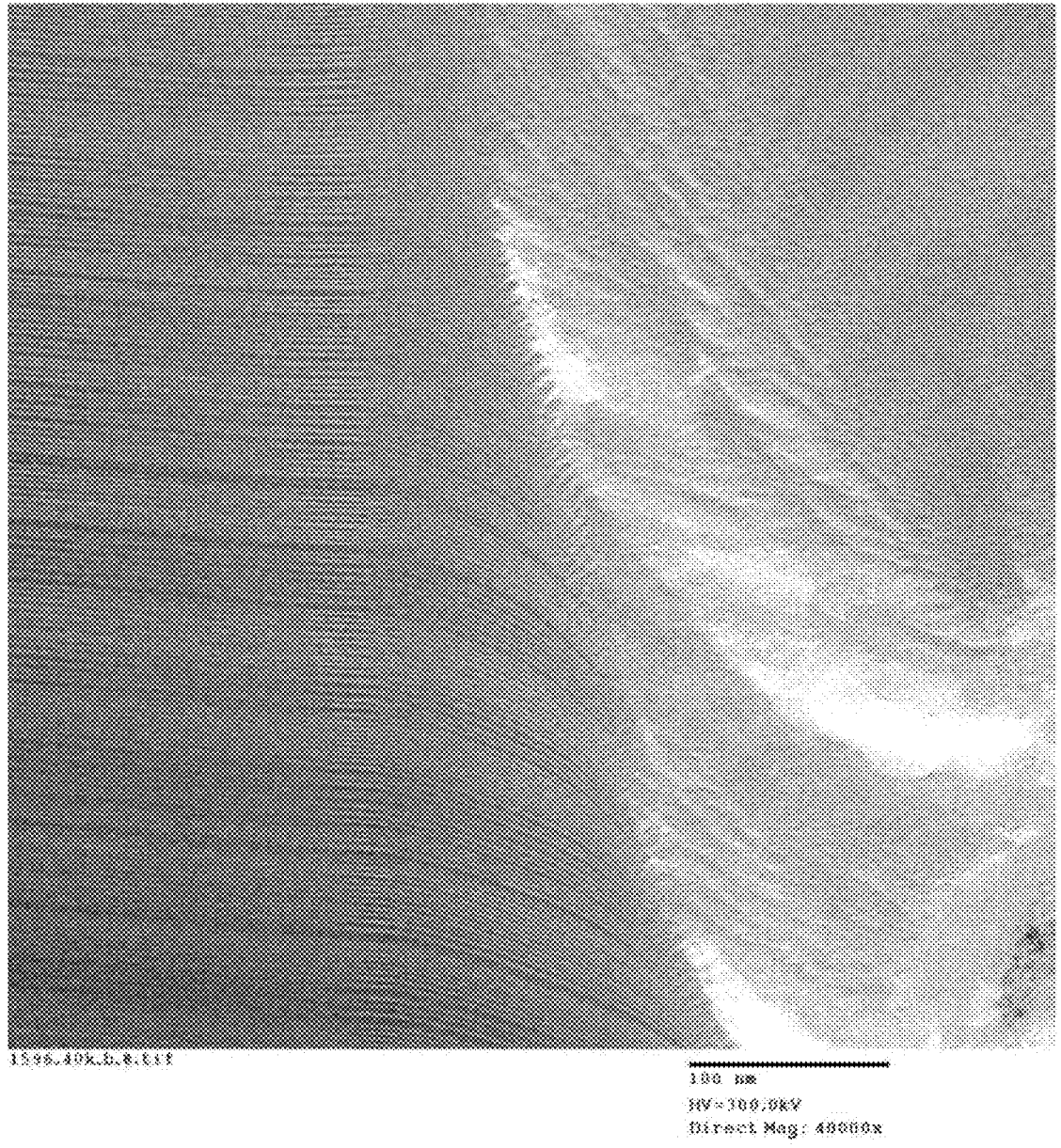
FIG. 4 is an enlarged view of the vicinity of the interface between the hard carbon film shown in FIG. 3 and a protruding shaped part.
Figure 5:
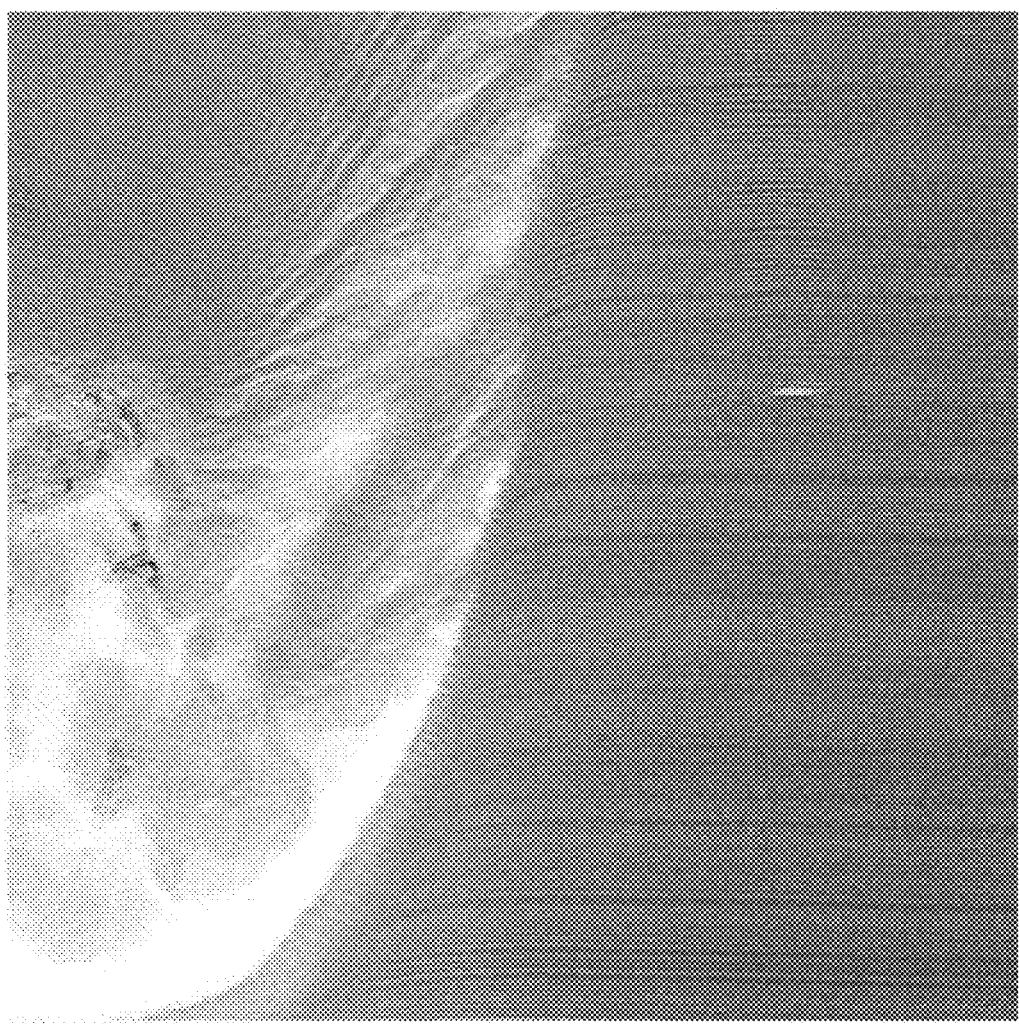
FIG. 5 is an enlarged view of the vicinity of the interface between the hard carbon film shown in FIG. 3 and a protruding shaped part.

FIG. 3 is a transmission electron microscope (TEM) image (bright field image) of a cross-section of a hard carbon film deposited as described above. In addition, FIG. 4 and FIG. 5 are enlarged views of the vicinity of the interface between the hard carbon film shown in FIG. 3 and a protruding shaped part. Further, in FIG. 3 to FIG. 5, a carbon film 6 having low hardness, which will be described below, is layered.

As shown in FIG. 3, there is a region brighter than other parts around the hard carbon film 2 and the protruding shaped part 3, particularly, between the bottom 4 of the protruding shaped part 3 and the hard carbon film 2, and the presence of a low density layer with a high content of hydrogen and a void caused by cracking in the region is indicated.

Furthermore, it is found from FIG. 4 and FIG. 5 that a super-multilayer structure in which bright layers and dark layers having thicknesses are alternately layered at a nano level is formed in the hard carbon film 2.

Further, the protruding shaped part 3 is not likely to fall off from the hard carbon film 2 when the protruding shaped part 3 is formed at a deep position close to the substrate side, and therefore, if a film thickness of the hard carbon film 2 is thick, it is preferable to reduce the protruding shaped parts 3 formed at deep positions by using a deposition technique and deposition conditions that are likely to generate less protruding shaped parts 3 at the beginning of deposition, for example, deposition using simple filtering with a shielding plate, using a low arc current, or the like, and returning to a predetermined deposition technique or deposition conditions toward the surface of the hard carbon film 2.

Specifically, it is preferable for D to be 90% or more of the entire protruding shaped part 3 that is formed at a depth of 1.5 μm or less.

In addition, considering the protruding shaped part 3 easily falling off from the hard carbon film 2, although a higher content of terminal atoms is better, a higher overall content of terminal atoms inside the hard carbon film 2 leads to a decrease in hardness thereof, which may cause deterioration in wear resistance. For this reason, it is preferable for a content of terminal atoms in the side outer circumferential part 3c and the bottom 4 of the protruding shaped part 3 and the surface parts 2b and 2c of the hard carbon film 2 facing 3c and 4 to be higher than a content of terminal atoms in other parts of the hard carbon film 2.

When Ar gas is introduced together with a gas containing terminal atoms during the deposition of the hard carbon film 2, some of terminal atoms in the outermost surface part 2a of the hard carbon film 2 and the outermost surface part 3d of the protruding shaped part 3 are removed due to the effect of physical etching using Ar ions. Meanwhile, since an electric field is concentrated on the protruding shaped part 3 on the boundary part 7 between the hard carbon film 2 and the protruding shaped part 3, the electric field becomes weak, physical etching using Ar ions becomes weak, and thus it becomes difficult for the terminal atoms to be removed. Therefore, the situation causes a state in which the surface part 2*b* and the surface part 2*c* having a higher content of terminal atoms than other parts are easily formed.

Furthermore, in order to make the protruding shaped part 3 more easily fall off, it is preferable for a content of hydrogen in the hard carbon film 2 to be 5 to 15 atom %, and at this time, it is preferable for a nanoindentation hardness to be 35 GPa or greater.

In addition, it is preferable for the peak position of the G-peak of the hard carbon film 2 in a Raman spectrum to be higher in the inside of the hard carbon film than the surface thereof, thus a hard carbon film having a high content of hydrogen in the surface and a low content of hydrogen in the inside is deposited, and therefore, a hard carbon film formed with the supply of hydrogen atoms that are terminal atoms in a sufficient amount to the surface can be provided.

[2] Manufacturing Method for Hard Carbon Film

A hard carbon film according to the above-described embodiment can be manufactured through the following steps.

1. Preparation of Base Material

First, a base material for forming a hard carbon film is prepared and set in a deposition tank. At that time, a noble gas such as Ar gas or hydrogen gas is introduced into the film to a deposition tank to generate plasma, a bias voltage is applied to the base material, and thereby dirt and an oxide layer on the surface of the base material on which a hard carbon film is to be formed are desirably removed.

Then, if a metal film as an intermediate layer is formed in advance on the surface on which a hard carbon film is formed from which dirt and the oxide layer have been removed, adhesion with the hard carbon film can be desirably enhanced. Further, the intermediate layer (metal film) can be formed using the vacuum arc vapor deposition which uses a metal raw material such as Cr or W as an arc vaporization source.

2. Formation of Hard Carbon Film

A hard carbon film is formed on the base material using the vacuum arc vapor deposition which uses a Graphite cathode as an arc vaporization source. At that time, a gas containing hydrogen atoms as terminal atoms like a hydrocarbon gas such as methane gas or acetylene gas or hydrogen gas is introduced into the deposition tank. Accordingly, the carbon around the protruding shaped parts that grow having, as the nuclei, graphite fine particles scattering from the graphite vaporization source can be terminated by the hydrogen, and the carbon on the surface of the hard carbon film being deposited can be terminated by hydrogen. As a result, bonding of the protruding shaped parts to the hard carbon film can be suppressed, and thus the protruding shaped parts can be caused to easily fall off from the hard carbon film.

In that case, it is preferable to control the introduction of the gas so that a content of hydrogen in the deposited hard carbon film is 5 to 15 atom %, and a hard carbon film containing a high content of hydrogen can be formed by increasing the amount of gas introduced. By controlling the introduction of the gas so that a content of hydrogen in the hard carbon film is 5 to 15 atom %, the hard carbon film from which protruding shaped parts can be easily removed while maintaining high hardness can be obtained.

In addition, it is preferable to deposit the hard carbon film by setting the amount of the gas introduced into the region of the hard carbon film to a thickness of 0.3 μm at the beginning of deposition smaller than that introduced into the deeper region so that a content of terminal atoms in the region to the thickness of 0.3 μm at the beginning of deposition is lower than that of terminal atoms in the region deposited thereafter. Accordingly, by reducing the supply of hydrogen atoms serving as terminal atoms in the region with a smaller number of protruding shaped parts, durability can be increase in the entire film while facilitating removal of the protruding shaped parts.

Further, when carbon ions are continuously generated from the graphite vaporization source and the base material is irradiated with the carbon ions during the deposition, the supply of hydrogen atoms serving as terminal atoms is insufficient for the generated carbon ions even if a gas is introduced, and thus it is not possible to sufficiently terminate the bond of the hydrogen to the carbon on the surface of the hard carbon film, and it is difficult to sufficiently suppress the bonding of the protruding shaped parts to the hard carbon film unless a larger amount of gas is introduced.

Therefore, it is preferable for the hard carbon film not to be periodically irradiated with carbon ions coming from the graphite vaporization source. While the film is not irradiated with carbon ions coming from the graphite vaporization source, the supply of hydrogen atoms increase, thus the surface of the hard carbon film can be subjected to sufficient termination even if a small amount of gas is introduced, and therefore the bonding of the protruding shaped parts to the hard carbon film can be sufficiently suppressed.

[3] Coating of Low-Hardness Carbon Film

Figure 6:
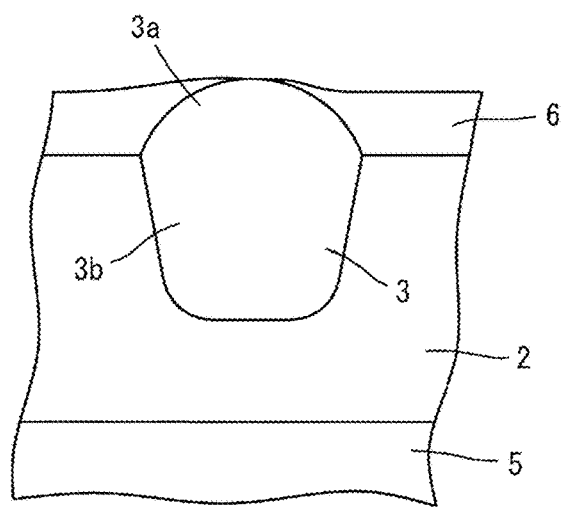
FIG. 6 is a schematic diagram illustrating a cross-section of a hard carbon film covered by a carbon film having low hardness.

In the present embodiment, a carbon film with a lower hardness than the above-described hard carbon film may be coated as an upper layer of the hard carbon film. FIG. 6 is a schematic view of a cross-section of the hard carbon film whose upper layer has been coated with a low-hardness carbon film.

With respect to the hard carbon film formed as described above, since the protruding shaped parts 3 can easily fall off from the hard carbon film 2 as described above, in a case where a lapping treatment is performed after a low-hardness carbon film 6 is coated, the protruding shaped parts 3 can be easily removed even in a weak lapping treatment that is not likely to affect the low-hardness carbon film 6. In addition, since the low-hardness carbon film 6 is coated on the hard carbon film 2 even after the lapping treatment, a more excellent abrasion reduction effect can be obtained in comparison to a case of the hard carbon film 2 alone.

In addition, since the high-hardness hard carbon film 2 exists on the base material 5 even if the low-hardness carbon film 6 is abraded, seizure does not occur between sliding counterpart materials. Furthermore, even when the low-hardness carbon film 6 undergoes wear, the sliding surface is smoothed due to the wear of the low-hardness carbon film 6, a low friction coefficient can be maintained as before.

A content of hydrogen in the low-hardness carbon film 6 is preferably 20 atom % or higher. In addition, an ID/IG value of a Raman spectrum is preferably 0.7 or more. Accordingly, a dramatic effect attributable to the coating of the above-described low-hardness carbon film 6 can be exhibited.

In addition, the low-hardness carbon film 6 may contain metal elements of Cr, Fe, W, Ti, and the like, silicon, nitrogen, and boron, thus generation of a tribofilm is promoted or occurrence of abnormal wear is suppressed, and therefore low abrasiveness can be exhibited.

Further, in the present embodiment, a thickness of the low-hardness carbon film 6 is preferably 0.1 to 1.0 μm in order to sufficiently exhibit the above-described effects.

Although the low-hardness carbon film may be coated as described above using a deposition apparatus different from that for the hard carbon film, there is concern of the adhesion of the low-hardness carbon film to the hard carbon film deteriorating since the surface of the hard carbon film deposited first is exposed to the air and dirt in that case, and therefore, it is preferable to deposit the hard carbon film and then consecutively deposit and coat the low-hardness carbon film thereon in the same apparatus.

In the present embodiment, the hard carbon film is deposited on the base material in the vacuum arc vapor deposition apparatus, a rare gas such as Ar gas and a hydrocarbon gas are introduced, a bias voltage is applied to the base material to cause self-discharge CVD discharge, and thereby the low-hardness carbon film is deposited and coated on the hard carbon film.

Specifically, the present inventor has ascertained that the friction coefficient greatly dropped in comparison to the case of a hard carbon film alone when the gas containing hydrogen atoms was introduced to deposit the hard carbon film having a thickness of 1 μm on the base material, a hydrocarbon gas was introduced thereto, and the low-hardness carbon film was deposited and coated thereon using a self-discharge plasma CVD method in which a DC voltage is applied to the base material.

Further, as another deposition method of depositing and coating a low-hardness carbon film, a CVD method of using CVD discharge with an external plasma source, a reactive sputtering method of having a graphite cathode as a sputtering source, introducing a rare gas such as Ar gas and a hydrocarbon gas, and depositing a film, or the like can be used.

In addition, a hard carbon film having a high content of hydrogen can also be deposited and coated as a low-hardness carbon film using vacuum arc vapor deposition which is the same as the deposition method of the hard carbon film. However, when this method is employed, an amount of gas introduced needs to be increased to increase a content of hydrogen. As a result, gas pressure in the deposition tank rises, and arc discharge (arcing) easily occurs on the base material on which the hard carbon film has been deposited. In addition, an amount of ions radiated onto the base material (an amount of current flowing to the base material) on which the hard carbon film has been deposited increases, which leads to an abrupt temperature increase, and thus there is concern of the hard carbon film being carbonized. Considering the above description, the above-described CVD method or reactive sputtering method is preferably employed as a deposition method of depositing and coating the low-hardness carbon film.

[4] Application of Hard Carbon Film to Sliding Member

A sliding member whose sliding surface has a hard carbon film according to the above-described embodiment can exhibit sufficient wear resistance by suppressing abrasive wear caused by falling protruding shaped part even when the sliding member slides in an oil, and can bring a dramatic reduction in a friction coefficient since recesses generated after the protruding shaped parts fall off function as oil reservoirs. In addition, in a case where the oil is oil containing MoDTC, abnormal wear does not occur in the hard carbon film, and since a low-hardness carbon film is further coated as an upper layer of the hard carbon film, the low-hardness carbon film is removed in an early stage due to abnormal wear, a surface suitable for sliding is formed in a shorter period of time, and therefore, a lower friction coefficient can be expected.

Further, examples of the sliding member that slides in oil containing MoDTC may include, for example, engine parts such as valve lifters, piston pins, piston rings, bearings, pistons, valve, fuel injection plungers, and the like.

Further, when the sliding member is produced, the hard carbon film according to the present embodiment can allow most protruding shaped parts to be removed in an initial stage of sliding even if the lapping treatment is not performed thereon after the deposition since bonding of the hard carbon film to the protruding shaped parts is very weak and the protruding shaped parts can be caused to easily fall off therefrom, and the lapping treatment is unnecessary in an environment in which running-in can be performed. In addition, even in a case where the lapping treatment is to be performed, the protruding shaped parts can be easily removed in a weaker lapping treatment than for a conventional hard carbon film that is produced in vacuum arc vapor deposition, for example, aero-lapping, or the like.

EXAMPLE

[1] Evaluation on Characteristics of Hard Carbon Film

First, an evaluation test for characteristics of a hard carbon film was conducted.

1. Production of Specimen (1) Example 1-1

A hard carbon film having a thickness of 1.0 μm (DLC-A) was deposited by using a carburized disc (31 mm in diameter (φ)×3 mm in thickness (t), HRC 60, and surface roughness Ra<0.01 μm) formed of SCM 415 as a base material, and introducing a gas containing hydrogen atoms onto the base material using arc vapor deposition.

Specifically, first, the base material with the surface from which dirt and an oxide layer had been removed beforehand was set in a jig inside a deposition apparatus, and a Cr film having a thickness of 50 nm was formed as an intermediate layer on the deposition target surface using an arc ion plating method using Cr as an arc vaporization source.

Next, while vaporizing a graphite cathode through arc discharge, Ar gas and methane gas were introduced from outside, and a hard carbon film having a thickness of 1.0 μm was deposited on the base material. Further, at this time, by rotating the jig on which the base material was set, deposition is performed while a time in which carbon ions are not periodically radiated from the graphite vaporization source is set, and the content of hydrogen in the hard carbon film was controlled at 5 to 15 atom %.

(2) Example 1-2

A hard carbon film having a thickness of 1.0 μm was first deposited on a base material on which an intermediate layer had been formed likewise similarly to Example 1-1. Then, Ar gas and acetylene gas were introduced into the same deposition apparatus, self-discharge CVD discharge was generated by applying a bias voltage of 600 V thereto at a gas pressure of 3.0 Pa, and thereby a low-hardness carbon film having a thickness of 0.3 μm was deposited and coated on the hard carbon film.

(3) Comparative Example 1-1

A hard carbon film having a thickness of 1.0 μm was deposited on the same base material using conventional vacuum arc vapor deposition in which no gas is introduced. Specifically, the hard carbon film was deposited on the base material on which an intermediate layer had been formed as in Example 1-1 and Example 1-2 by introducing only Ar gas from outside while vaporizing a graphite cathode through arc discharge.

2. Evaluation of Film Characteristics

Each of the hard carbon films obtained in Example 1-1, Example 1-2, and Comparative example 1-1 was evaluated for the following items.

(1) Content of Hydrogen

A content of hydrogen in each of the hard carbon films was measured using Rutherford Backscattering Spectrometry (RBS).

As a result, it was ascertained that the content was 11 atom % in Example 1-1, and 11 atom % in the hard carbon film and 23 atom % in the low-hardness carbon film in Example 1-2. In addition, the content was equal to or lower than the measurement limit in Comparative example 1-1.

Figure 7:
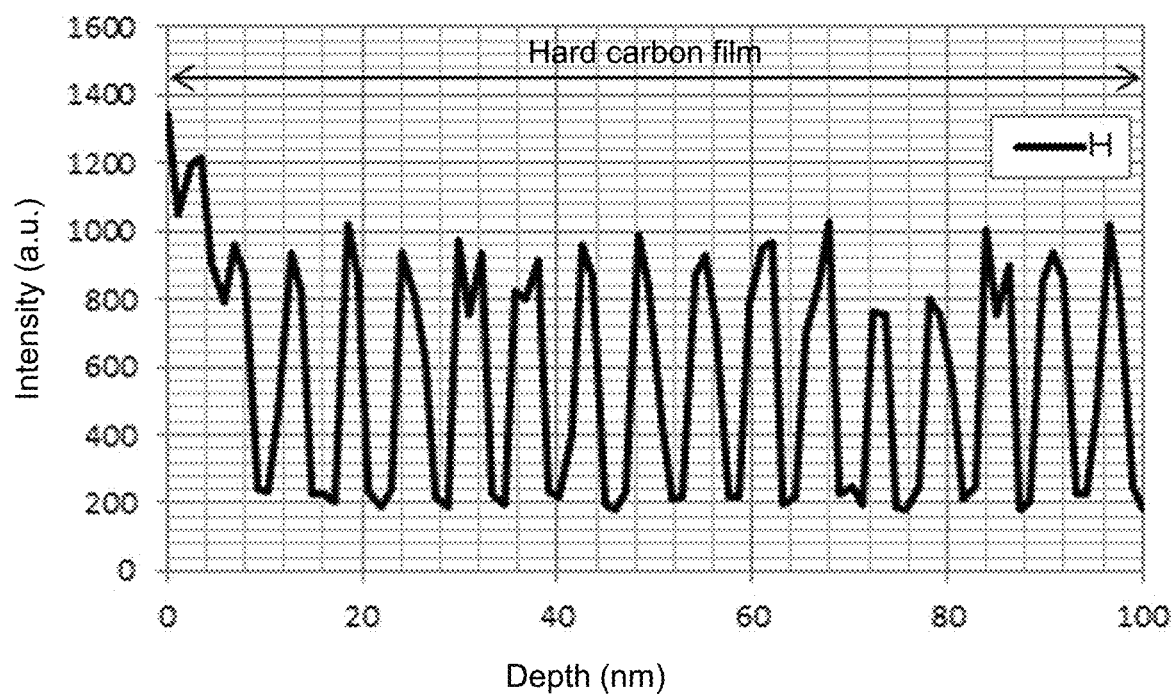
FIG. 7 is a graph showing a distribution of hydrogen atoms in a hard carbon film of Example 1-1 obtained from TOF-SIMS in the depth direction.
Figure 8:
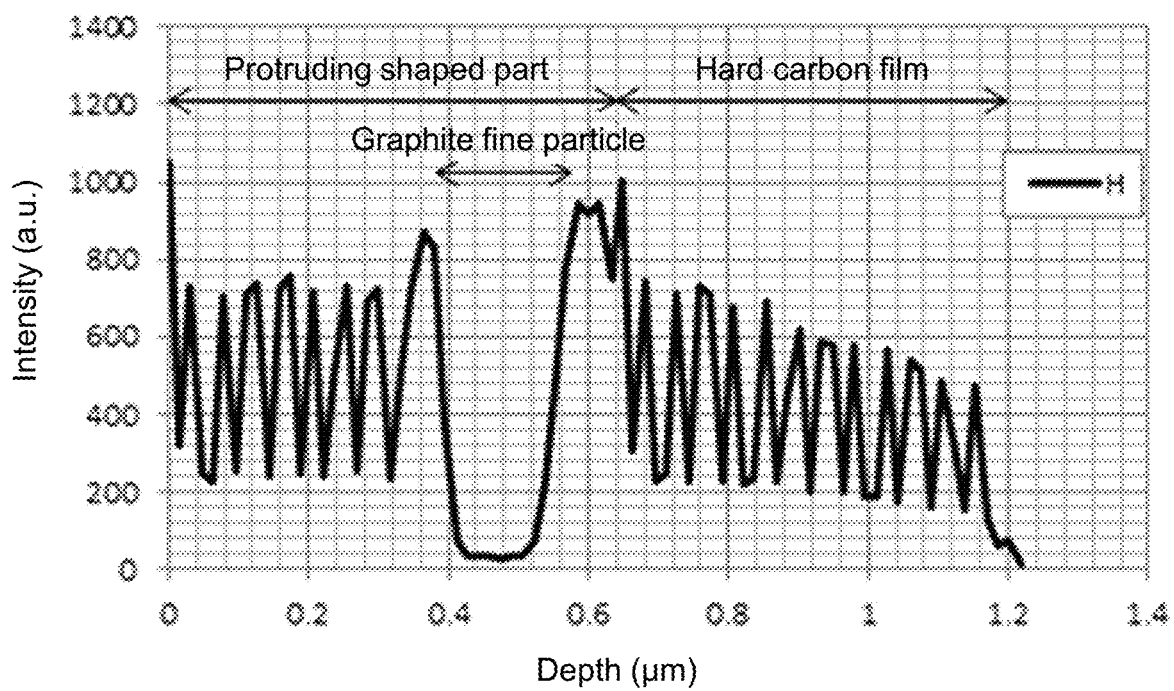
FIG. 8 is a graph showing a distribution of hydrogen atoms in a protruding shaped part of Example 1-1 obtained from TOF-SIMS in the depth direction.

In addition, in Example 1-1, when an amount of hydrogen in the hard carbon film in the depth direction was measured using Time-Of-Flight Secondary Ion Mass Spectrometry (TOF-SIMS), it was ascertained that the amount of hydrogen increased and decreased for every 2 to 4 nm as shown in FIG. 7. Furthermore, in measurement of the protruding shaped parts in the depth direction, it was ascertained that there were portions having a particularly large amount of hydrogen in the film and that there were portions a particularly large amount of hydrogen in regions at a depth of 0.55 to 0.63 μm between the protruding shaped parts and the hard carbon film as shown in FIG. 8. In FIGS. 7 and 8, the vertical axis represents intensity and the horizontal axis represents depth from the surface.

(2) $sp^3/(sp^3+sp^2)$ Ratio

The hard carbon films have a mixture of a $sp^2$ structure and a $sp^3$ structure, a hardness of the hard carbon film changes according to a ratio thereof ($sp^3/(sp^3+sp^2)$ ratio), and specifically, a hardness becomes higher as a ratio of $sp^3$ become higher.

In addition, since the $sp^3/(sp^3+sp^2)$ ratio is correlated with the (ID/IG) ratio based on a Raman spectrum, the value can be estimated from a result of Raman spectroscopy by using a calibration curve.

Specifically, Raman spectroscopy was performed by radiating laser light having a wavelength of 532 nm using NRS-5100 manufactured by JASCO Corporation. The obtained Raman spectrum was separated into two waveforms of the D-peak and G-peak that are often used for analysis of hard carbon films and interpreted. Specifically, a straight base line was drawn between 900 cm$^{-1}$ and 1800 cm$^{-1}$, the base line was processed to be zero, the D-peak centered around 1350 cm$^{-1}$ and the G-peak centered around 1550 cm$^{-1}$ were fitted to a Gaussian function and separated, and the area ID of the D-peak and the area IG of the G-peak were quantified.

A $sp^3/(sp^3+sp^2)$ ratio was obtained using the following empirical formula (Formula 1) based on the ID/IG area ratio obtained in Raman spectroscopy. This empirical formula can be used as a formula for estimating the $sp^3/(sp^3+sp^2)$ ratio since a good correlation was found by taking the correlation between the Raman spectroscopy result of various hard carbon films and the analysis result of the $sp^3/(sp^3+sp^2)$ ratio using nuclear magnetic resonance (NMR).

$$sp^3/(sp^3+sp^2) \text{ratio}=55.5X^2-163.9X+142.0 \quad \text{(Formula 1)}$$

X: ID/IG Area Ratio

As a result, it was ascertained that the ratio was 0.76 (ID/IG of 0.46) in Example 1-1, and the ratio of the hard carbon film was 0.76 (ID/IG of 0.46) and the ratio of the low-hardness carbon film was 0.43 (ID/IG of 0.85) in Example 1-2. In addition, the ratio was 0.90 (ID/IG of 0.36) in Comparative example 1-1.

(3) Film Hardness (Nanoindentation Hardness)

A nanoindentation hardness was measured as film hardness of each of the hard carbon films. Specifically, a nanoindentation hardness was measured at a load of 300 mgf using ENT-1100a that is an indentation hardness meter manufactured by Elionix Inc.

As a result, it was ascertained that the hardness was 38 GPa in Example 1-1, and the hardness of the hard carbon film was 38 GPa and the hardness of the low-hardness carbon film was 23 GPa in Example 1-2. In addition, it was ascertained that the hardness was 55 GPa in Comparative example 1-1.

(4) SEM Image

Figure 9:
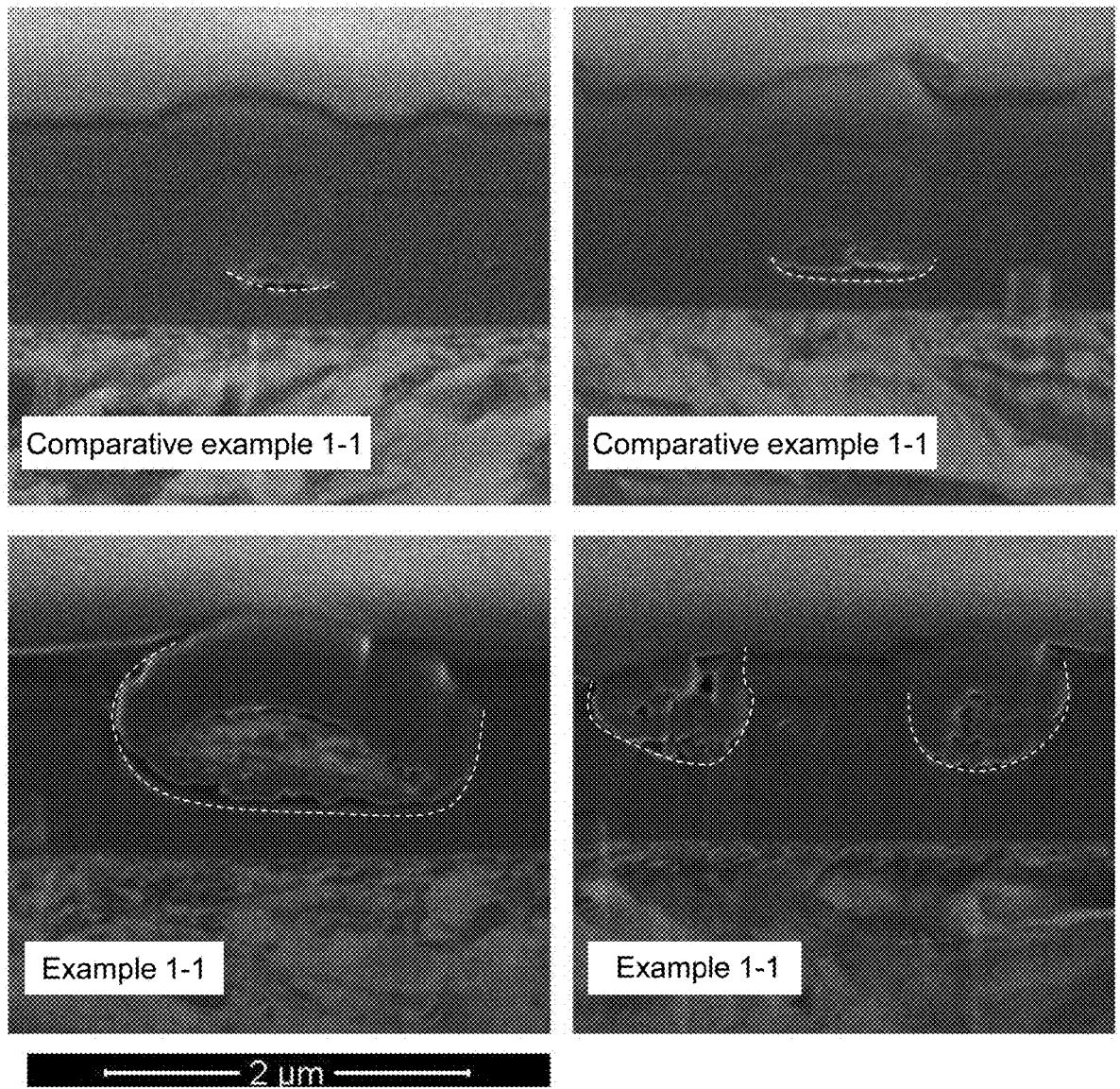
FIG. 9 shows cross-sectional SEM images from Example 1-1 and Comparative example 1-1.

FIG. 9 shows cross-sectional SEM images from Example 1-1 and Comparative example 1-1. According to FIG. 9, there are no spots having a significantly different contrast other than below the protruding shaped parts indicated by the dotted lines in Comparative example 1-1. This indicates that the hard carbon films and the protruding shaped parts were combined and continuous, which caused the protruding shaped parts not to easily fall off. Meanwhile, in Example 1-1, contrasts around the protruding shaped parts are significantly different as indicated by the dotted lines, and thus it is ascertained that the bonding of the hard carbon film to the protruding shaped parts was weak and the protruding shaped parts could easily fall off.

(5) Surface Roughness Measurement

Surface roughness of each of the hard carbon films was measured under the following measurement conditions using SPM-9700 manufactured by Shimadzu Corporation.

Scanner: 30 μm
Observation mode: Dynamic
X-Y scanning range: 30 μm
Scanning speed: 0.6 Hz
Number of pixels
　X: 256 pixels
　Y: 256 pixels
Scanning mode: Same height As a result, it was ascertained that Rz in Example 1-1 was 0.949 μm, Rz in Example 1-2 was 0.999 μm, and Rz in Comparative example 1-1 was 0.839 μm.

(6) Lapping Test

In order to investigate ease of removal of the protruding shaped parts, a lapping process was performed on the hard carbon films produced in Example 1-1 and Comparative example 1-1 using AERO LAP YT-300 manufactured by Yamashita Works Co., Ltd., under the following conditions, and then surface roughness was measured.

Speed of conveyer: 50% (50% of the maximum speed of AERO LAP YT300)
Lapping time: 3 minutes As a result, the surface roughness Rz in Example 1-1 was 0.323 μm, the surface roughness Rz in Comparative example 1-1 was 0.696 μm, and therefore it was found that the surface roughness was substantially halved even with the lapping process for a short period of time.

Figure 10:
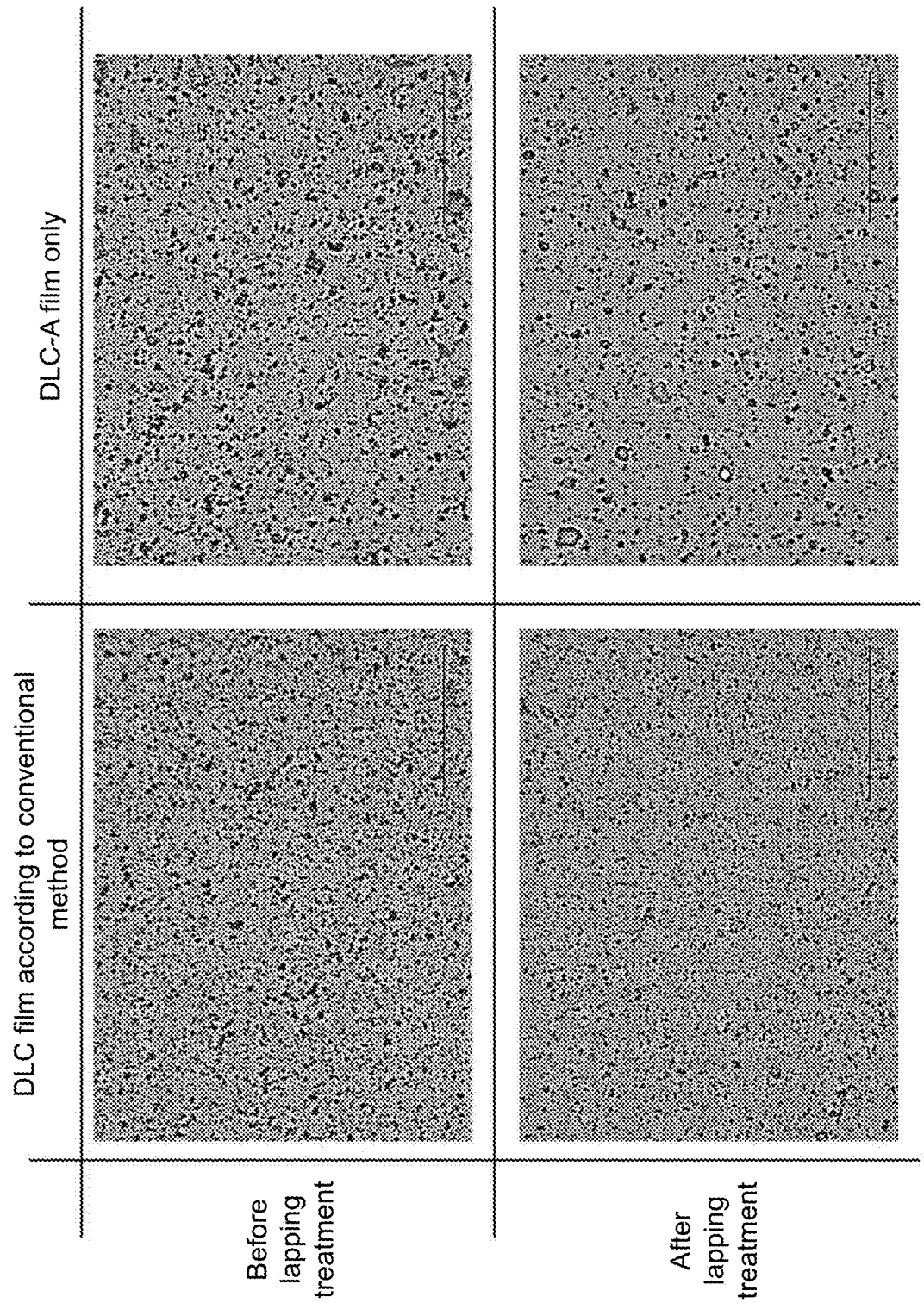
FIG. 10 shows enlarged photos showing states of surfaces before and after a lapping process.
Figure 11:
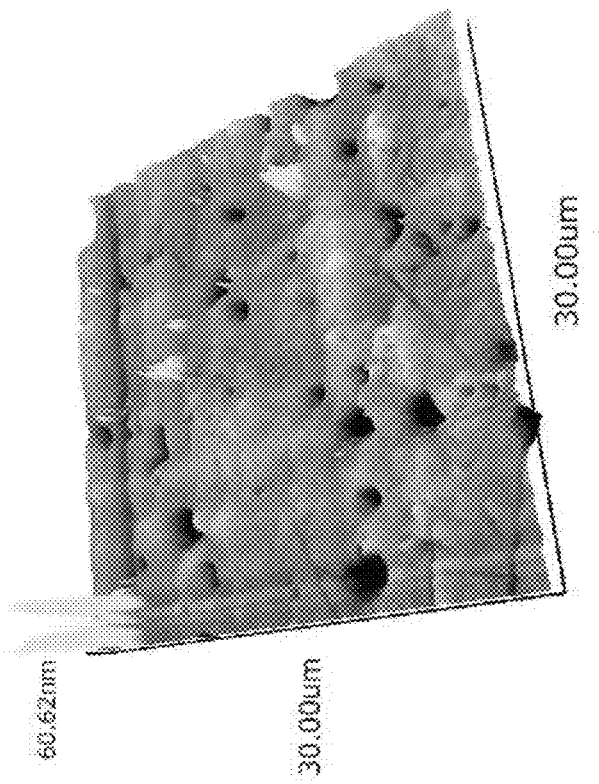
FIG. 11 shows views of three-dimensional shapes of surfaces after a lapping process obtained through SPM measurement.
Figure 11:
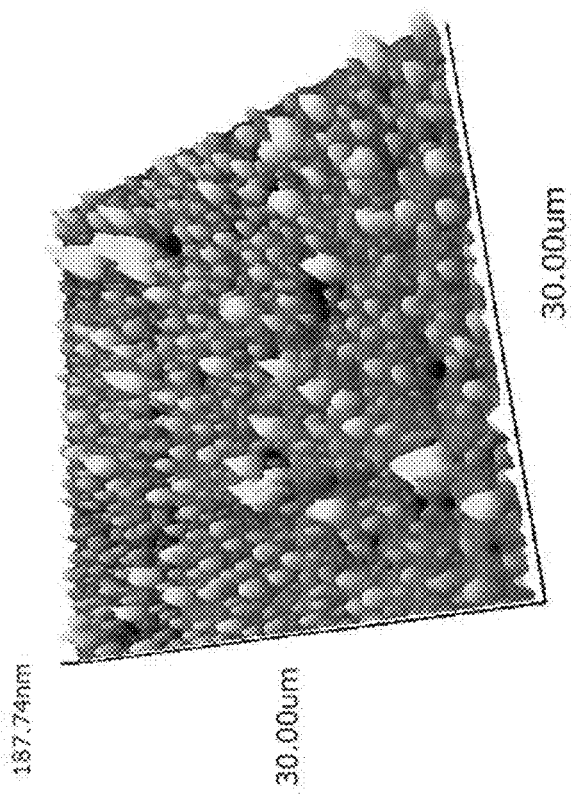

In addition, FIG. 10 shows enlarged photos of the surface states before and after the lapping process, and FIG. 11 shows views of the three-dimensional shapes of the surfaces after the lapping process measured through SPM. It was ascertained from FIG. 11 that, while most of the surface of the hard carbon film of Comparative example 1-1 had a convex structure including many remainder of the protruding shaped parts, the surface of the hard carbon film of Example 1-1 had less convex structure due to many removed protruding shaped parts and was sufficiently smoothed.

[2] Evaluation of Sliding Property of Sliding Member

Next, a test for evaluating a sliding property of a sliding member having the hard carbon film was performed.

1. Production of Specimen

A specimen of Example 2-1 was produced by deposition a hard carbon film in a similar manner as in Example 1-1 using a carburized material cylinder SCM 415 as a base material (15 mm in diameter (φ)×22 mm in length (L), HRC 60). Then, the specimen of Example 2-2 was produced by depositing the hard carbon film on which the low-hardness carbon film was coated in the similar manner as in Example 1-2, and the specimen of Comparative example 2-1 was produced by depositing the hard carbon film in the similar manner as in Comparative example 1-1. In addition, the specimen of Comparative example 2-2 was produced by depositing the hard carbon film on the base material using a CVD method.

2. Sliding Test Method

A sliding test was performed on each of the produced specimen by using a steel disk (100CR6 (DIN standard)) as a sliding object.

Figure 12:
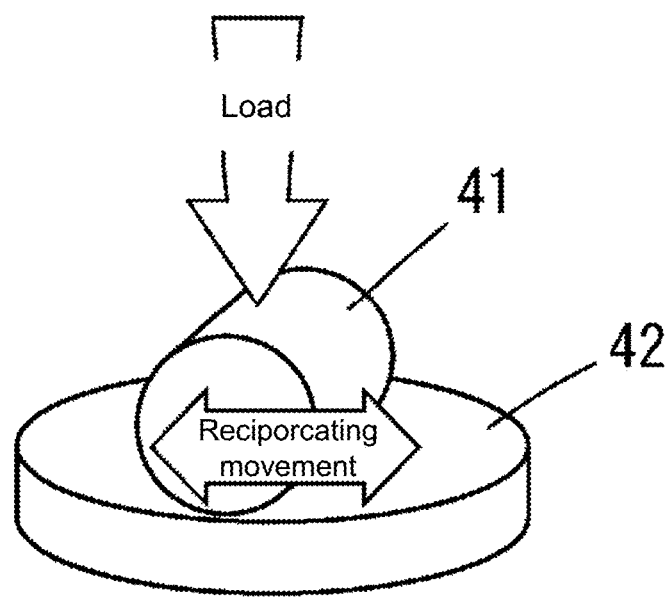
FIG. 12 is an explanatory diagram of a sliding test.

Specifically, the sliding test (SRV test) was performed to evaluate sliding characteristics by causing a cylinder 41 on which the hard carbon film was formed to reciprocally slide against the steel disk 42 using a Schwingungs Reibung and Verschleiss (SRV) tester manufactured by Optimol Instruments as illustrated in FIG. 12.

Further the test conditions in that case were as follows.
Load: 100 N (50 N only at the time of prior running-in)
Frequency: 33 Hz
Amplitude: 1.5 mm
Time: 120 minutes (5 minutes for prior running-in)
Temperature: 80° C.
Oil: MoDTC-added 0W-16

3. Test Result (a) Surface State and Cross-Section State

Figure 13:
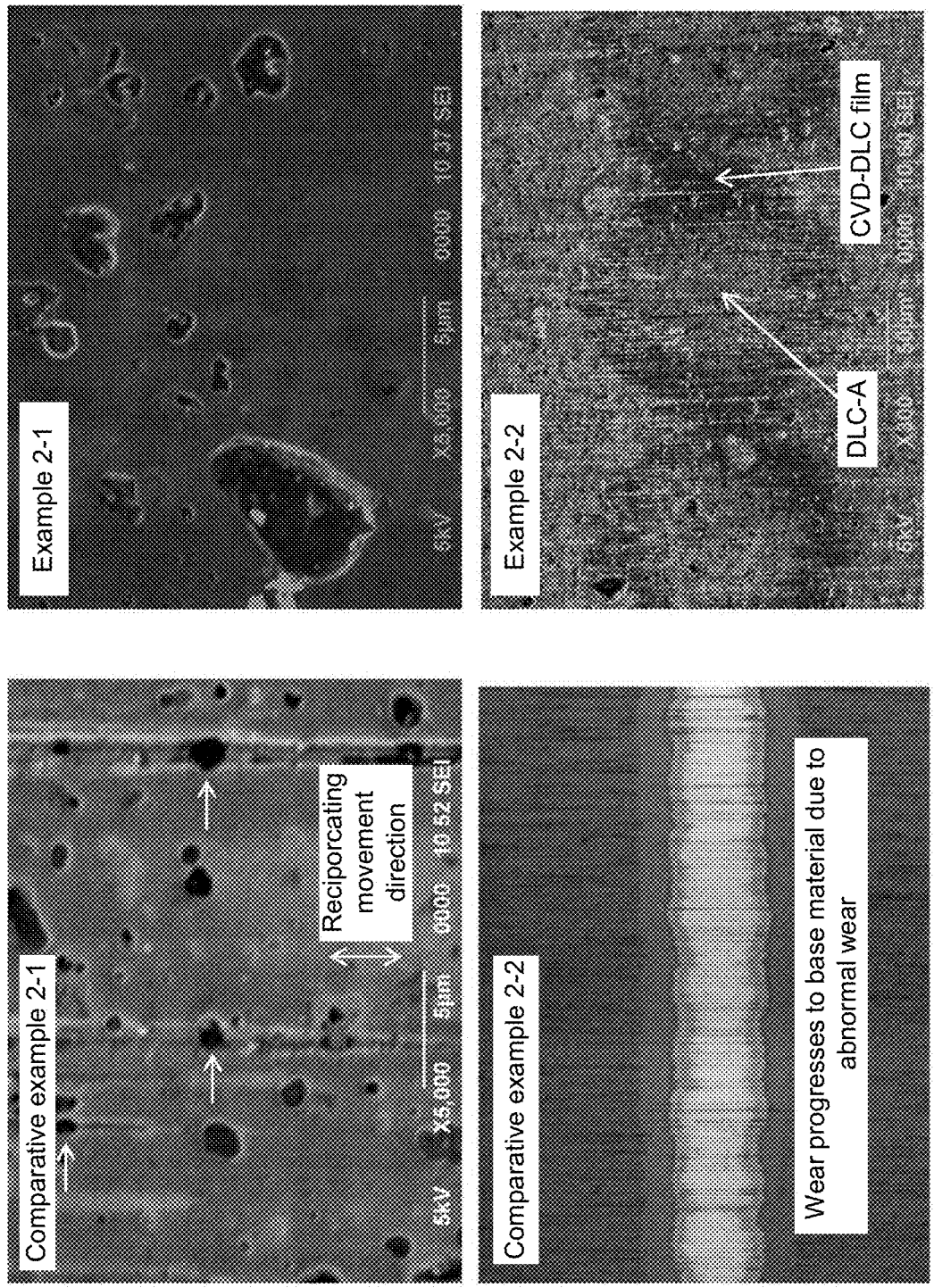
FIG. 13 shows SEM images of a sliding surface of each specimen after two hours of an SRV test.

The SEM images of the sliding surfaces of the specimen after two hours of the SRV test are shown in FIG. 13.

While abnormal wear did not occur in Comparative example 2-1 as is known from the past, the holes were formed in the parts indicated by the arrows after the protruding shaped parts had fallen off, scratches were visible in the reciprocating movement directions around the holes, and therefore it is ascertained from FIG. 13 that abrasive wear attributable to the falling protruding shaped part had occurred. In addition, it is ascertained from Comparative example 2-2 that wear had progressed to the base material due to abnormal wear.

On the other hand, since abnormal wear did not occur and the protruding shaped parts were removed before sliding in Example 2-1, it is ascertained that abrasive wear resulting from falling of the protruding shaped parts did not occur. In addition, it is ascertained that, although the hard carbon film was partly exposed due to abnormal wear of the low-hardness carbon film in Example 2-2, no further wear progressed. Accordingly, it was ascertained that the abrasive wear of the hard carbon films of Example 2-1 and Example 2-2 caused by the falling of the protruding shaped parts was suppressed.

(b) Friction Coefficient

Figure 14:
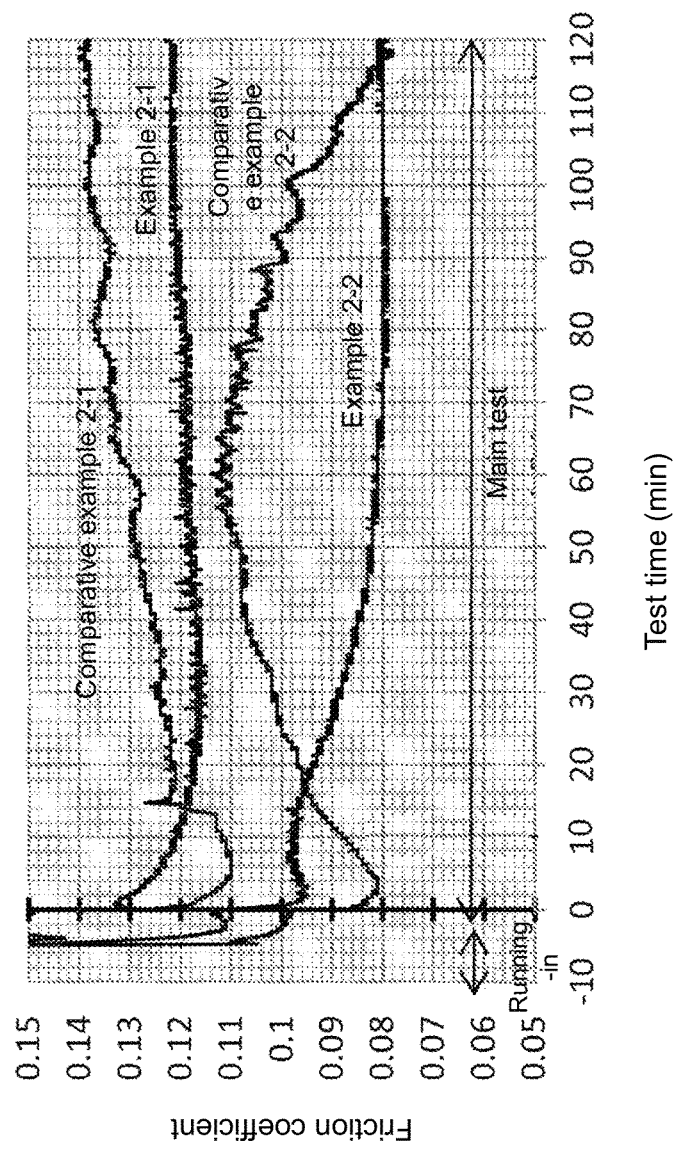
FIG. 14 is a graph showing change of a friction coefficient over time in a sliding test.

The change of the friction coefficient of each specimen over time during the sliding test is shown in FIG. 14.

It is ascertained from FIG. 14 that, in Comparative example 2-1, the friction coefficient increases over time and the protruding shaped parts that had fallen off were caught in sliding and thus stable sliding was not possible. Meanwhile, it is ascertained that, while a comparatively high friction coefficient was shown in Example 2-1 as in Comparative example 2-1, the behavior of the friction coefficient was stable.

In addition, it is ascertained that, while a low friction coefficient was shown in the beginning of sliding in Comparative example 2-2, an increase of the friction coefficient is shown from halfway, and then a low friction coefficient is shown again and reduced to a substantially half of that of Comparative example 2-1.

The reason for the cause of the changes of the friction coefficients can be considered as follows. That is, it is known that, in a case where a hard carbon film containing a high content of hydrogen is caused to slide in oil containing MoDTC, a low friction coefficient is shown due to a reaction of MoDTC, abnormal wear occurs at the same time, and thus the hard carbon film wears soon. Also in Comparative example 2-2, while a low friction coefficient was shown since the low-hardness carbon film (CVD-hard carbon film) containing a high content of hydrogen existed in the beginning of sliding, the CVD-hard carbon film wore out due to abnormal wear. Then, the friction coefficient became unstable when the steel serving as a base material began to be exposed. However, since the MoDTC-derived tribofilm was gradually formed on the steel thereafter, it is considered that the friction coefficient began to decrease with the formation of the tribofilm.

Meanwhile, in Example 2-2, the lower friction coefficient than in Comparative example 2-2 was shown consistently from the beginning of sliding. The decrease in the friction coefficient in the beginning of sliding is considered as the effect of the coated low-hardness carbon film (CVD-hard carbon film). The abnormal wear of the CVD-hard carbon film caused by MoDTC was mild wear while the speed of wear was high, and no abrasive wear occurred in the sliding part since the protruding shaped parts of the hard carbon film fell off, and thus, the hard carbon film and the sliding surface of the counterpart material were nicely flattened, and thus a surface suitable for sliding was formed. For this reason, the CVD-hard carbon film worn out, and even if the hard carbon film was exposed, the surface suitable for sliding was already formed, and therefore, it is considered that the low friction coefficient could be maintained.

Although the present disclosure has been described above based on the embodiments, the present disclosure is not limited thereto. Various modifications can be made on the above-described embodiments within a scope equal or equivalent to the present disclosure.

The invention claimed is:

1. A hard carbon film a sliding surface of a sliding member, the hard carbon film comprising:
   terminal atoms that bond to carbon atoms, wherein the terminal atoms are any one of hydrogen atoms, oxygen atoms and fluorine atoms; and
   a plurality of protruding shaped parts each of which has a part projecting from a surface of the hard carbon film, wherein the periphery of each of the plurality of protruding shaped parts is terminated by the terminal atoms,
   a content of the terminal atoms in a region to a thickness of 0.3 μm at the beginning of deposition of the hard carbon film is lower than a content of the terminal atoms in a region deposited thereafter,
   a distribution density of the protruding shaped parts increases toward the surface,
   among the plurality of protruding shaped parts, the number of protruding shaped parts growing from a position shallower than a depth of 1.5 μm from the surface is 90% or more of the entire plurality of protruding shaped parts, and the hard carbon film is formed in a way that a hard carbon layer containing a larger amount of terminal atoms bonding to carbon atoms and a hard carbon layer containing a smaller amount of terminal atoms bonding to carbon atoms are alternately layered for every 2 to 4 nm.

2. The hard carbon film according to claim 1, wherein a carbon layer having a higher content of terminal atoms than other parts of the hard carbon film is formed in a periphery of the protruding shaped parts.

3. The hard carbon film according to claim 1, wherein the terminal atoms are hydrogen atoms, and a content of hydrogen is 5 to 15 atom %.

4. The hard carbon film according to claim 1, wherein a nanoindentation hardness is 35 GPa or greater.

5. The hard carbon film according to claim 1, wherein a peak position of a G-peak in a Raman spectrum is higher in an inside than the surface.

6. The hard carbon film according to claim 1, wherein a carbon film with a lower hardness is further coated as an upper layer.

7. The hard carbon film according to claim 6, wherein the carbon film with a lower hardness is a carbon film having a content of hydrogen of 20 atom % or higher and less than 50 atom %.

8. The hard carbon film according to claim 6, wherein the carbon film with a lower hardness has an ID/IG ratio in a Raman spectrum of 0.7 or higher.

9. The hard carbon film according to claim 6, wherein the carbon film with a lower hardness contains any one of a metal element, silicon, nitrogen, and boron.

10. The hard carbon film according to claim 6, wherein a thickness of the carbon film with a lower hardness is 0.1 to 1.0 μm.

11. A sliding member to be used for sliding in an oil containing sulfurized molybdenum dialkyldithiocarbamate, wherein the hard carbon film according to claim 1 is formed on a sliding surface.

12. A manufacturing method for a hard carbon film for depositing the hard carbon film on a sliding surface of a sliding member using arc vapor deposition having graphite as a vaporization source, the method comprising:

introducing a gas containing terminal atoms that bond to carbon atoms, wherein a gas containing any one of hydrogen atoms, oxygen atoms and fluorine atoms is used as the gas containing terminal atoms that bond to carbon atoms, causing a plurality of protruding shaped parts to grow on a surface of the hard carbon film while terminating a periphery of the plurality of protruding shaped parts by bonding the terminal atoms to the carbon atoms wherein, in a region of a hard carbon film to a thickness of 0.3 μm at the beginning of deposition, the hard carbon film is deposited by reducing an amount of the gas introduced at the beginning of deposition compared with an amount of the gas introduced for other regions, a distribution density of the protruding shaped parts increases toward the surface, among the plurality of protruding shaped parts, the number of protruding shaped parts growing from a position shallower than a depth of 1.5 μm from the surface is 90% or more of the entire plurality of protruding shaped parts, and the hard carbon film is deposited while an amount of the gas introduced is caused to change over time, so that the hard carbon film is formed in a way that a hard carbon layer containing a larger amount of terminal atoms bonding to carbon atoms and a hard carbon layer containing a smaller amount of terminal atoms bonding to carbon atoms are alternately layered for every 2 to 4 nm.

13. The manufacturing method for a hard carbon film according to claim 12, wherein, in the arc vapor deposition, the hard carbon film is deposited in a state in which the film is not irradiated with carbon ions coming from the graphite vaporization source at a regular time interval.

14. The manufacturing method for a hard carbon film according to claim 12, wherein the hard carbon film is deposited while introducing Ar gas together with the gas containing terminal atoms that bond to carbon atoms.

* * * * *